(12) United States Patent
Faulkner et al.

(10) Patent No.: US 10,714,911 B2
(45) Date of Patent: Jul. 14, 2020

(54) METHOD OF MANUFACTURING A SUBMERSIBLE ELECTRICAL ENCLOSURE FOR A SWITCHGEAR ASSEMBLY

(71) Applicant: COOPER TECHNOLOGIES COMPANY, Houston, TX (US)

(72) Inventors: Mark Faulkner, Greenwood, SC (US); Michael Davis Pearce, Plum Branch, SC (US); Travis Spoone, Greenwood, SC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 265 days.

(21) Appl. No.: 15/815,034

(22) Filed: Nov. 16, 2017

(65) Prior Publication Data
US 2018/0076599 A1   Mar. 15, 2018

Related U.S. Application Data

(62) Division of application No. 14/933,590, filed on Nov. 5, 2015, now Pat. No. 9,859,691.

(60) Provisional application No. 62/078,082, filed on Nov. 11, 2014.

(51) Int. Cl.
| | |
|---|---|
| *H01H 11/00* | (2006.01) |
| *H01H 11/02* | (2006.01) |
| *H01H 11/04* | (2006.01) |
| *H01H 65/00* | (2006.01) |
| *H02B 1/28* | (2006.01) |
| *H02B 13/01* | (2006.01) |

(Continued)

(52) U.S. Cl.
CPC .............. *H02B 1/28* (2013.01); *B29C 70/72* (2013.01); *B29C 70/882* (2013.01); *H01L 23/3107* (2013.01); *H01L 23/49548* (2013.01); *H02B 1/40* (2013.01); *H02B 13/01* (2013.01); *B29K 2023/065* (2013.01); *B29K 2105/16* (2013.01); *B29K 2995/0005* (2013.01); *B29K 2995/0007* (2013.01); *B29K 2995/0069* (2013.01); *B29L 2009/00* (2013.01); *B29L 2031/3481* (2013.01)

(58) Field of Classification Search
CPC .. H02B 1/28; H02B 13/01; H02B 1/40; B29C 70/72; B29C 70/882; B29K 2023/065; B29K 2105/16; B29K 2995/0007; B29K 2995/0069; B29K 2995/0005; H01L 23/49548; H01L 23/3107; B29L 2009/00; B29L 2031/3481
See application file for complete search history.

(56) References Cited

U.S. PATENT DOCUMENTS 3,751,939 A * 8/1973 Bright ...................... F25C 1/24
                                                              62/137
4,170,000 A   10/1979 Trayer
(Continued)

*Primary Examiner* — Paul D Kim
(74) *Attorney, Agent, or Firm* — Eckert Seamans Cherin & Mellott, LLC

(57) ABSTRACT

A submersible electrical enclosure is for a switchgear assembly. The switchgear assembly includes a number of electrical switching apparatus. The submersible electrical enclosure includes: a plurality of sides defining an interior, the interior receiving each of the electrical switching apparatus, each side including: a conductive polymeric layer facing away from the interior, and an insulative polymeric layer molded to the conductive polymeric layer. The insulative polymeric layer faces the interior and substantially overlays the conductive polymeric layer.

19 Claims, 8 Drawing Sheets

(51) Int. Cl.
  *B29C 70/72* (2006.01)
  *B29C 70/88* (2006.01)
  *H01L 23/31* (2006.01)
  *H01L 23/495* (2006.01)
  *H02B 1/40* (2006.01)
  *B29K 23/00* (2006.01)
  *B29K 105/16* (2006.01)
  *B29L 9/00* (2006.01)
  *B29L 31/34* (2006.01)

(56) References Cited

U.S. PATENT DOCUMENTS

| | | | |
|---|---|---|---|
| 4,365,227 A | | 12/1982 | Trayer |
| 4,710,419 A | * | 12/1987 | Gregory ............ B29C 45/14639 174/255 |
| 6,365,826 B1 | | 4/2002 | Stendardo et al. |
| 6,982,057 B2 | * | 1/2006 | King ........................ B29C 41/04 264/255 |
| 7,670,639 B2 | * | 3/2010 | Gallant ................. B29C 43/222 264/145 |
| 7,883,328 B2 | * | 2/2011 | Lin ........................ H01B 13/34 425/113 |
| 9,190,223 B2 | * | 11/2015 | Felden ................. H01H 1/2041 |
| 2006/0171127 A1 | | 8/2006 | Kadoya et al. |
| 2008/0158823 A1 | | 7/2008 | Tominaga et al. |
| 2008/0278918 A1 | | 11/2008 | Tominaga et al. |
| 2009/0039548 A1 | * | 2/2009 | Claussen ................ B29C 41/06 264/255 |
| 2009/0117758 A1 | | 5/2009 | Yamaguchi |
| 2009/0119899 A1 | | 5/2009 | Muench et al. |
| 2009/0163053 A1 | | 6/2009 | Yamaguchi et al. |
| 2013/0108086 A1 | | 5/2013 | Yamashita et al. |

* cited by examiner

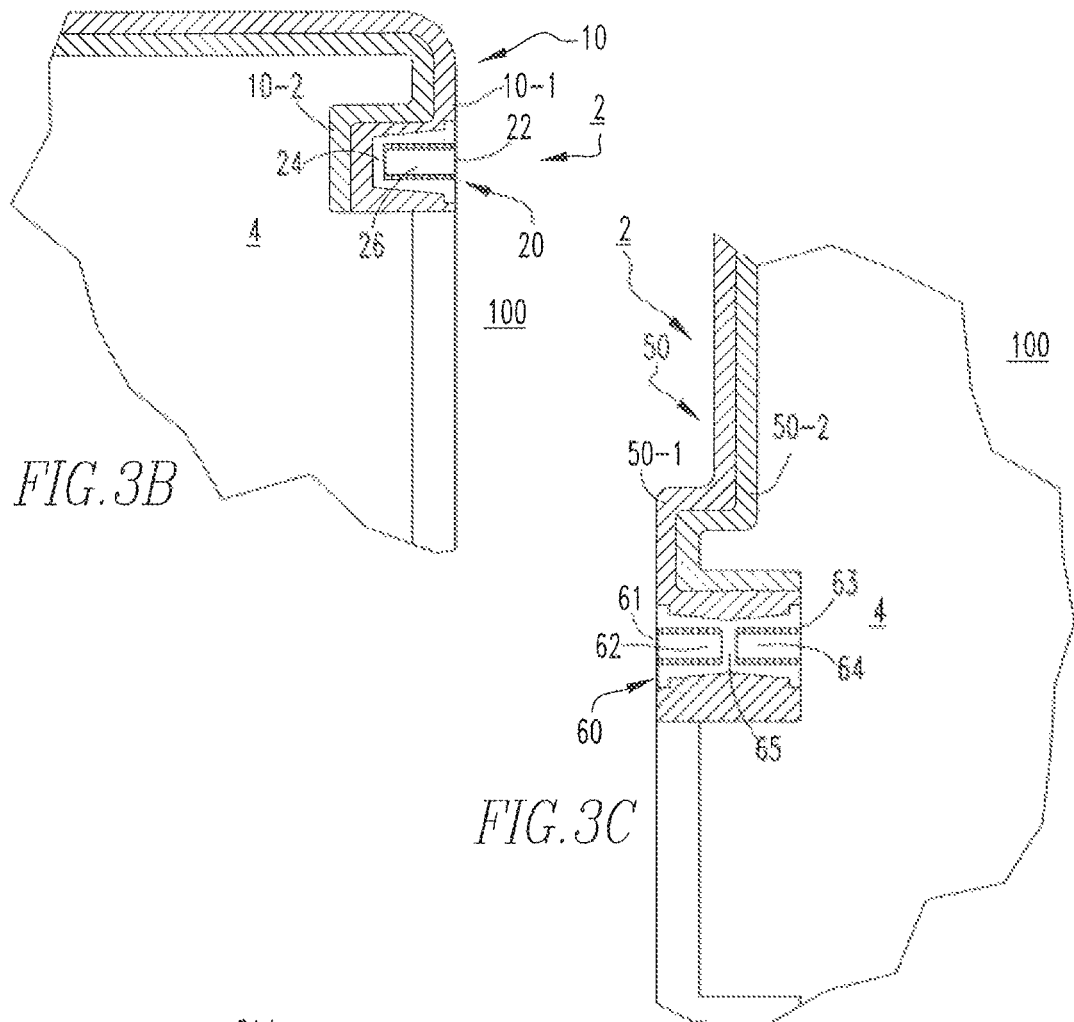
FIG.3B
FIG.3C
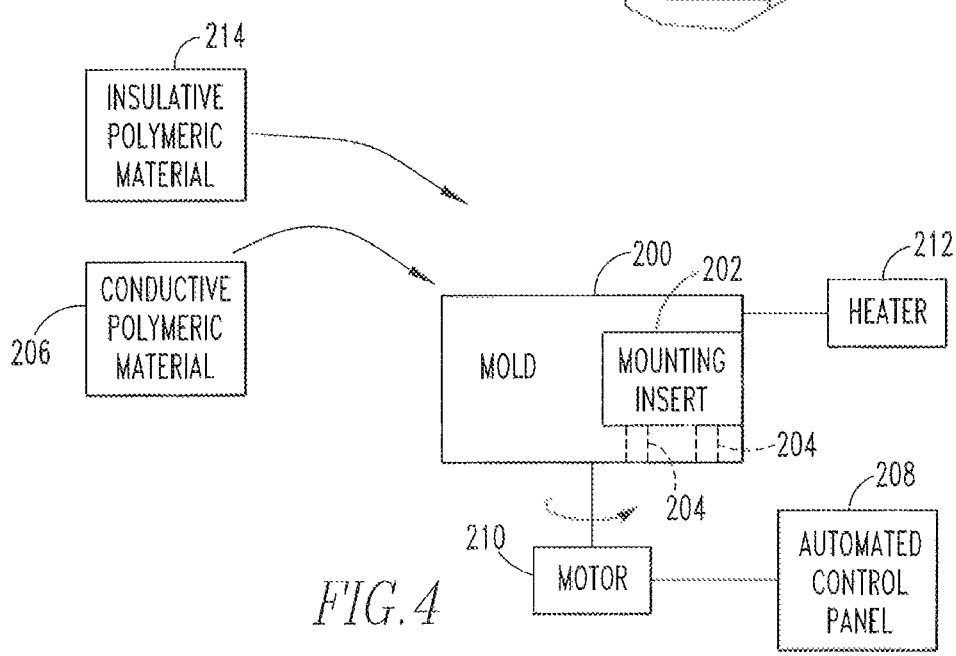
FIG.4

METHOD OF MANUFACTURING A SUBMERSIBLE ELECTRICAL ENCLOSURE FOR A SWITCHGEAR ASSEMBLY

CROSS REFERENCE TO RELATED APPLICATIONS

This application is a divisional application of and claims priority to U.S. patent application Ser. No. 14/933,590, filed Nov. 5, 2015, now U.S. Pat. No. 9,859,691, and entitled "SWITCHGEAR ASSEMBLY, AND SUBMERSIBLE ELECTRICAL ENCLOSURE AND METHOD OF MANUFACTURING A SUBMERSIBLE ELECTRICAL ENCLOSURE THEREFOR," which claims the benefit of U.S. Provisional Patent Application Ser. No. 62/078,082, filed Nov. 11, 2014, which is incorporated by reference herein.

BACKGROUND

Field

The disclosed concept pertains generally to switchgear assemblies and, more particularly, to switchgear assemblies including for example, electrical switching apparatus. The disclosed concept also pertains to submersible electrical enclosures for switchgear assemblies. The disclosed concept further pertains to methods of manufacturing submersible electrical enclosures.

Background Information

Electrical switching apparatus, such as medium voltage switching apparatus (e.g., without limitation, air switches, vacuum circuit breakers, loadbreak switches and non-loadbreak switches), provide protection for electrical systems from electrical fault conditions, such as current overloads, short circuits, abnormal voltage and other fault conditions. In operation, such electrical switching apparatus are often exposed to moisture, sewage, dirt, small animals, and other contaminants. To provide protection against such harsh environments, the electrical switching apparatus are often housed in submersible electrical enclosures made of stainless steel. However, such enclosures are expensive to fabricate, heavy, and sensitive to leaks as a result of necessary welds. Additionally, a known drawback with such stainless steel submersible electrical enclosures is condensation. To mitigate condensation, stainless steel submersible electrical enclosures typically have heaters installed.

There is, therefore, room for improvement in switchgear assemblies and in submersible electrical enclosures for switchgear assemblies.

There is also room for improvement in methods of manufacturing submersible electrical enclosures therefor.

SUMMARY

These needs and others are met by embodiments of the disclosed concept, which are directed to a switchgear assembly, and submersible electrical enclosure and associated method of manufacturing a submersible electrical enclosure.

In accordance with one aspect of the disclosed concept, a submersible electrical enclosure for a switchgear assembly is provided. The switchgear assembly includes a number of electrical switching apparatus. The submersible electrical enclosure comprises: a plurality of sides defining an interior, the interior being structured to receive each of the electrical switching apparatus, each side comprising: a conductive polymeric layer facing away from the interior, and an insulative polymeric layer molded to the conductive polymeric layer. The insulative polymeric layer facing the interior and substantially overlaying the conductive polymeric layer.

As another aspect of the disclosed concept, a switchgear assembly comprises: a number of electrical switching apparatus; and a submersible electrical enclosure comprising: a plurality of sides defining an interior, the interior receiving each of the electrical switching apparatus, each side comprising: a conductive polymeric layer facing away from the interior, and an insulative polymeric layer molded to the conductive polymeric layer. The insulative polymeric layer faces the interior and substantially overlays the conductive polymeric layer.

As another aspect of the disclosed concept, a method of manufacturing a submersible electrical enclosure for a switchgear assembly is provided. The switchgear assembly includes a number of electrical switching apparatus each structured to be received within an interior of the submersible electrical enclosure. The method comprises the steps of: providing a mold; applying a predetermined quantity of conductive material to the mold; rotating the mold; applying a predetermined quantity of insulative material to the predetermined quantity of conductive material; rotating the mold; and removing each of the predetermined quantity of conductive material and the predetermined quantity of insulative material from the mold.

BRIEF DESCRIPTION OF THE DRAWINGS

A full understanding of the disclosed concept can be gained from the following description of the preferred embodiments when read in conjunction with the accompanying drawings in which:

FIG. 3B is an enlarged section view of FIG. 3A, taken along line 3B-3B;

FIG. 3C is an enlarged view of a portion of FIG. 3A; and

FIG. 4 is a schematic diagram, in block form, of a rotational molding process, in accordance with the disclosed concept.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts.

As employed herein, the statement that two or more parts or components "engage" one another shall mean that the parts touch and/or exert a force against one another either directly or through one or more intermediate parts or components.

As employed herein, the term "coupling member" refers to any suitable connecting or tightening mechanism expressly including, but not limited to, rivets, screws, bolts and the combinations of bolts and nuts (e.g., without limitation, lock nuts) and bolts, washers and nuts.

As employed herein, the term "conductive polymeric layer" or "conductive polymeric material" shall mean a polymeric material, such as high density polyethylene, which contains a conductive material, such as a carbon filler and/or conductive fibers. The "conductive polymeric layer" or "conductive polymeric material" has a surface resistivity of greater than or equal to 30 ohms/square at 1 millimeter.

As employed herein, the term "insulative polymeric layer" or "insulative polymeric material" shall mean a polymeric material, such as high density polyethylene, which has a dielectric strength greater than or equal to 600 volts/millimeter.

As employed herein, the term "blind insert" shall mean a mounting insert such as a receptacle having an open end and a closed end expressly including, but not limited to, a receptacle having a threaded open end to receive a coupling member and a closed end that prevents the coupling member from extending through the receptacle.

As employed herein, the term "double blind insert" shall mean a mounting insert having two portions each with an open end, and being separated by a middle portion, expressly including, but not limited to, a mounting insert having two threaded open ends each to receive a respective coupling member, and a middle portion that separates the two respective portions and prevents the coupling members from engaging each other.

Figure 1A:
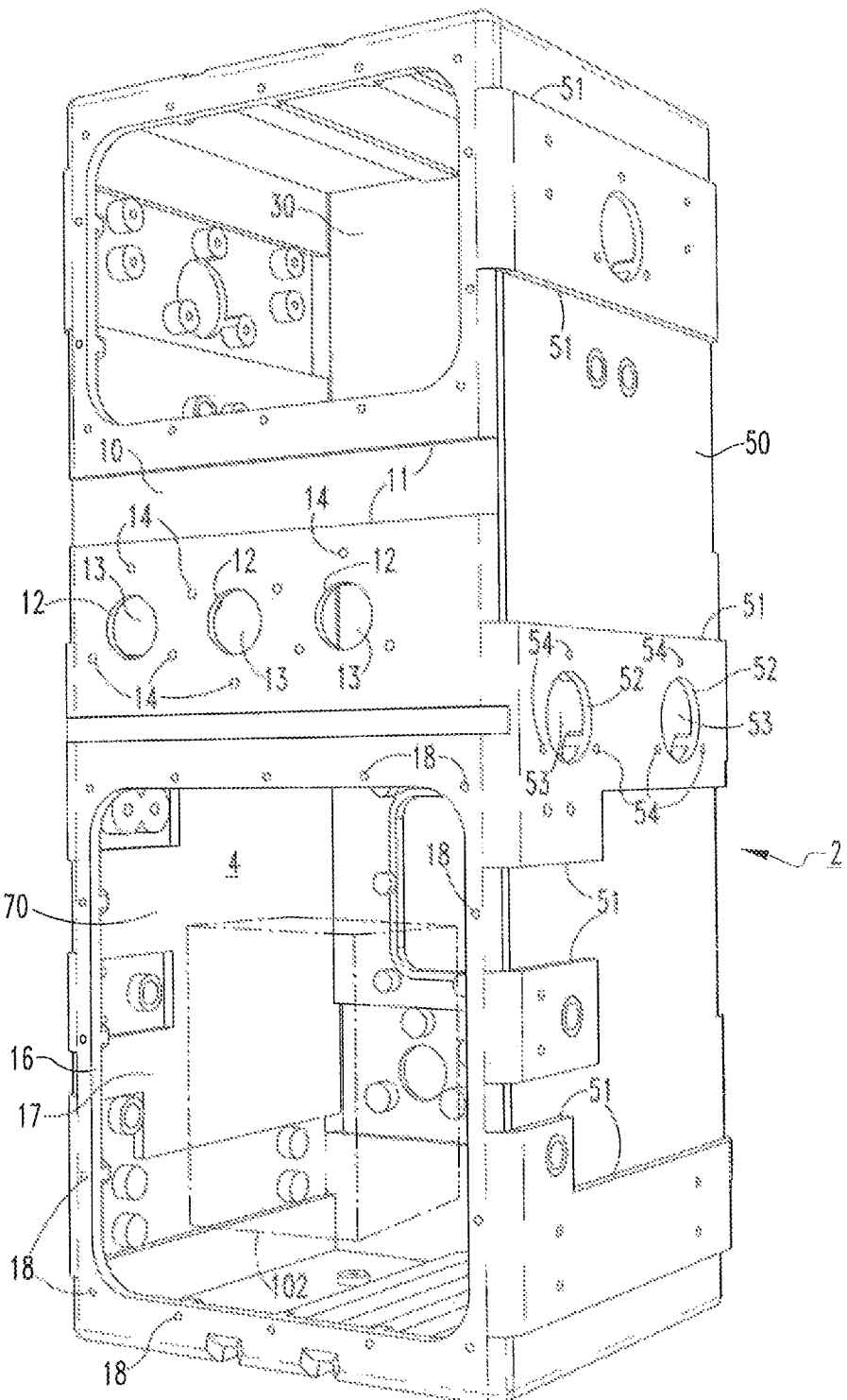
FIG. 1A is a front isometric view of a submersible electrical enclosure, shown with an electrical switching apparatus, in accordance with an embodiment of the disclosed concept.
Figure 1B:
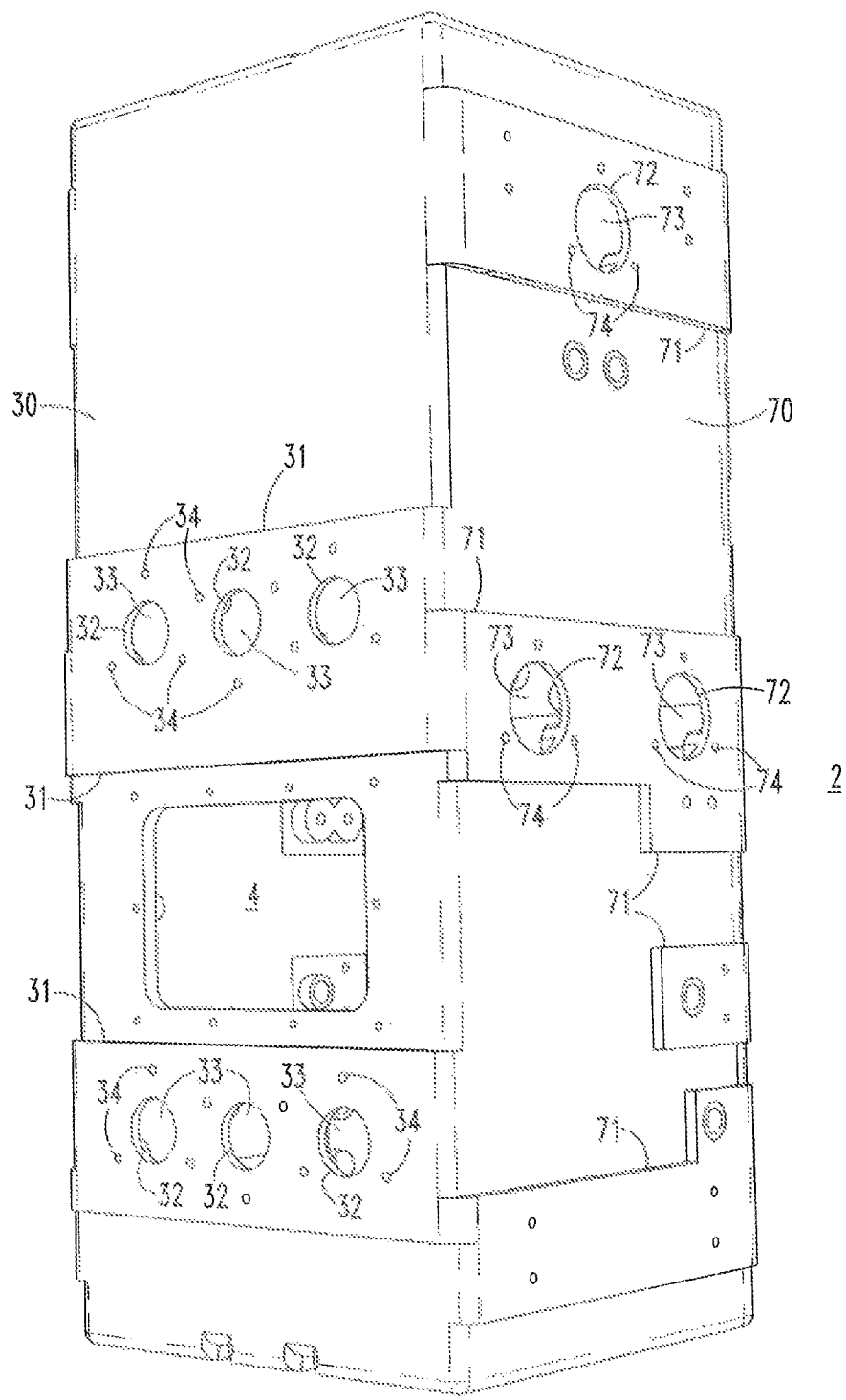
FIG. 1B is a rear isometric view of the submersible electrical enclosure of FIG. 1A.

FIGS. 1A and 1B show a submersible electrical enclosure 2 for a switchgear assembly (see for example, switchgear assembly 100, shown in FIGS. 2A-3C), in accordance with a non-limiting embodiment of the disclosed concept. The example submersible electrical enclosure 2 includes a number of sides (four sides 10,30,50,70 are indicated in FIG. 1A). As shown in FIG. 1A, the first side 10 is opposite and generally parallel to the second side 30, and the third side 50 is opposite and generally parallel to the fourth side 70. The first side 10 and the second side 30 each extend from the third side 50 to the fourth side 70.

The sides 10,30,50,70 define an interior 4. The interior 4 is the generally enclosed region that is internal with respect to each of the sides 10,30,50,70. Any structure (e.g., without limitation, an electrical switching apparatus, such as an example circuit breaker 102 (shown in simplified form in phantom line drawing in FIG. 1A)) that is located in the interior 4 is substantially internal with respect to each of the sides 10,30,50,70. In other words, the sides 10,30,50,70 enclose (i.e., house, surround, contain) the circuit breaker 102, which is received in the interior 4 of the submersible electrical enclosure 2. Therefore, it will be appreciated that because the circuit breaker 102 is located in the interior 4 of the submersible electrical enclosure 2, in operation the submersible electrical enclosure 2 advantageously protects the circuit breaker 102.

The first side 10 has a number of circular-shaped mounting edges (three circular-shaped mounting edges 12 are shown and indicated) and a number of rectangular-shaped mounting edges (one rectangular-shaped mounting edge 16 is indicated). The mounting edges 12 each define a respective opening 13, and the mounting edge 16 defines an opening 17. Also, the first side 10 includes a plurality of mounting inserts (only six mounting inserts 14 and six mounting inserts 18 are indicated), the function of which will be discussed in greater detail hereinbelow. Three respective mounting inserts 14 surround each of the respective mounting edges 12, and the mounting inserts 18 surround the mounting edge 16. Stated differently, each of the openings 13,17 is substantially located inside (i.e., internal, within, bounded by) the enclosed region on the first side 10 defined by a respective number (i.e., three of the respective mounting inserts 14 for each of the openings 13, and each of the mounting inserts 18 for the opening 17) of the mounting inserts 14,18.

Continuing to refer to FIG. 1A, the third side 50 includes a number of circular-shaped mounting edges (two circular-shaped mounting edges 52 are indicated in FIG. 1A) that each define a respective opening 53. The third side 50 further includes a plurality of mounting inserts 54, three of which surround each respective mounting edge 52. As shown in FIG. 1B, the second side 30 includes a number of circular-shaped mounting edges (six circular-shaped mounting edges 32 are shown and indicated in FIG. 1B) that each define a respective opening 33. The second side 30 further includes a plurality of mounting inserts 34 (nine mounting inserts 34 are indicated, although it will be appreciated that three mounting inserts 34 surround each respective mounting edge 32). The fourth side 70 includes a number of circular-shaped mounting edges (three circular-shaped mounting edges 72 are shown and indicated in FIG. 1B) that each define a respective opening 73. The fourth side 70 further includes a plurality of mounting inserts 74 (six mounting inserts 74 are indicated, although it will be appreciated that three mounting inserts 74 surround each respective mounting edge 72).

Figure 2A:
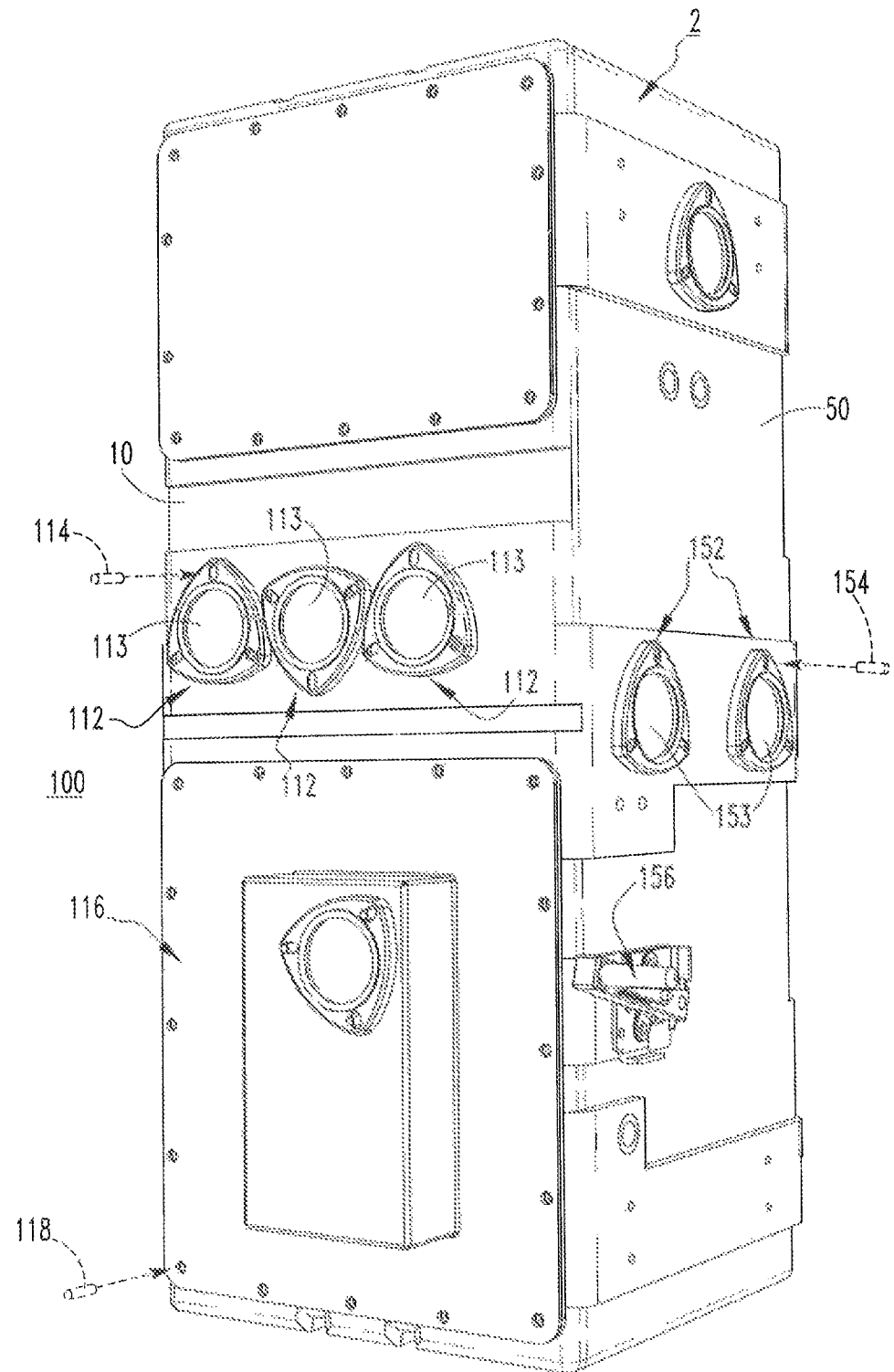
FIG. 2A is a front isometric view of a switchgear assembly, including the submersible electrical enclosure of FIG. 1A.

FIGS. 2A-3C show different views of the switchgear assembly 100, which includes the submersible electrical enclosure 2 and the circuit breaker 102 (FIG. 1A). Although the switchgear assembly 100 depicted herein is a primary disconnect for network vaults (not shown) that in operation would be connected to a high side of a network transformer (not shown), it will be appreciated that the submersible electrical enclosure 2, or a suitable alternative submersible electrical enclosure (not shown), may be used in alternative switchgear assemblies. Referring to FIG. 2A, the switchgear assembly 100 further includes a number of viewing windows (three viewing windows 112 and two viewing windows 152 are indicated), a rectangular-shaped access cover 116, and an operating handle 156. The operating handle 156 is located on the third side 50, and cooperates with the circuit breaker 102 (FIG. 1A). Each of the viewing windows 112,152 is aligned with and mounted to a corresponding one of the mounting edges 12,52 (FIG. 1A) of the submersible electrical enclosure 2. More specifically, each of the viewing windows 112,152 includes a respective circular-shaped generally transparent portion 113,153 that substantially overlays a corresponding one of the openings 13,53 (FIG. 1A). In this manner, the viewing windows 112,152 advantageously allow an operator to see inside the switchgear assembly 100. The access cover 116 is aligned with and mounted to the mounting edge 16 (FIG. 1A), and is structured to allow an operator to access the circuit breaker 102 (FIG. 1A).

Furthermore, the mounting inserts 14,18,54 (FIG. 1A) advantageously allow the viewing windows 112,152 and the access cover 116 to be coupled to the submersible electrical enclosure 2. More specifically, the switchgear assembly 100 further includes a number of coupling members (three example coupling members 114,118,154 are shown exploded in dashed line drawing in FIG. 2A) that advantageously extend through a corresponding hole in a corresponding one of the viewing windows 112,152 and the access cover 116, and into a corresponding one of the mounting inserts 14,18,54 (FIG. 1A). Thus, the mounting inserts 14,18,54 (FIG. 1A) and the coupling members 114, 118,154 advantageously allow the viewing windows 112, 152 and the access cover 116 to be coupled to the submersible electrical enclosure 2.

Figure 2B:
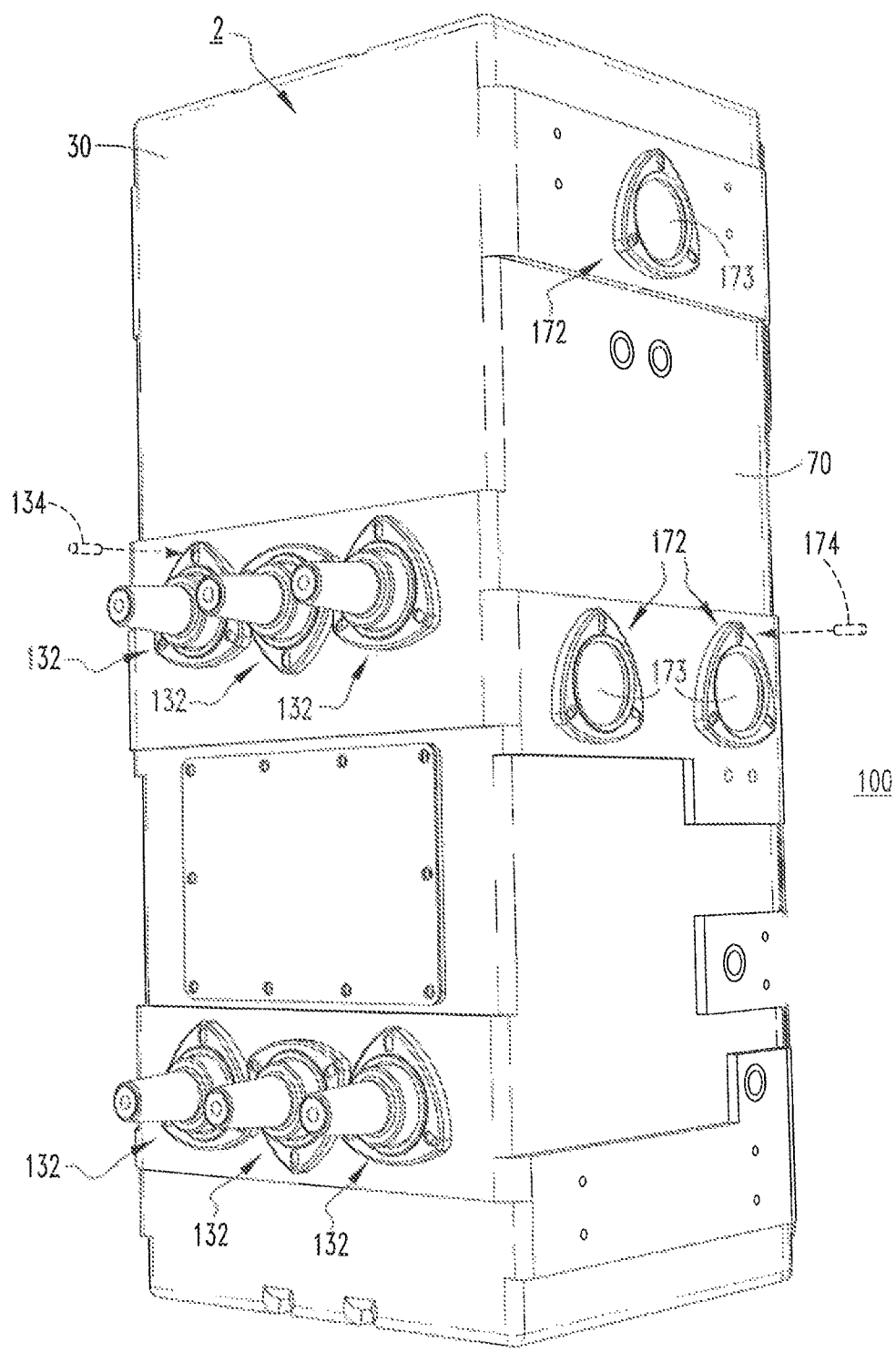
FIG. 2B is a rear isometric view of the switchgear assembly and submersible electrical enclosure therefor of FIG. 2A.
Figure 2C:
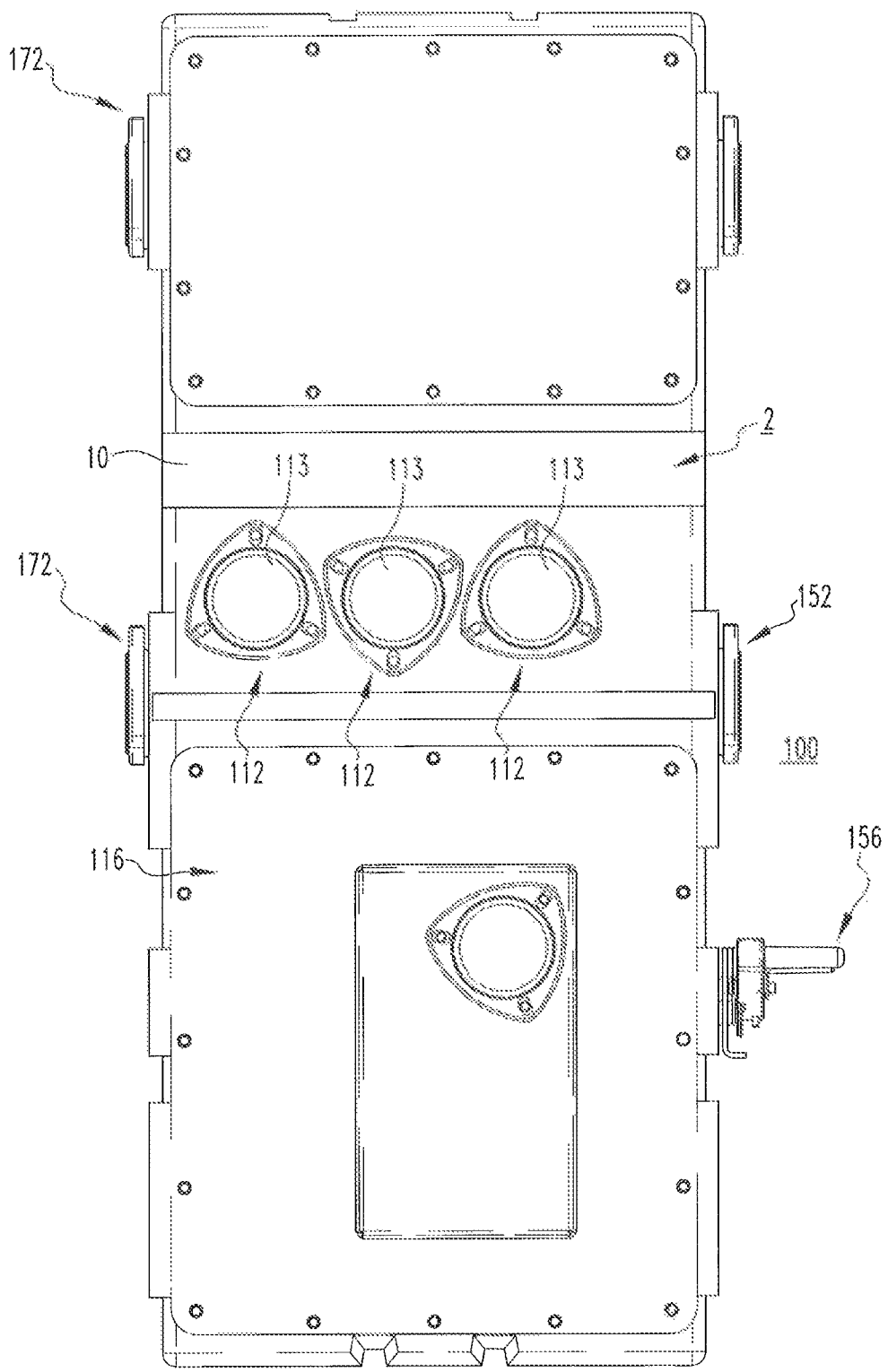
FIG. 2C is a front elevation view of the switchgear assembly and submersible electrical enclosure therefor of FIG. 2A.
Figure 2D:
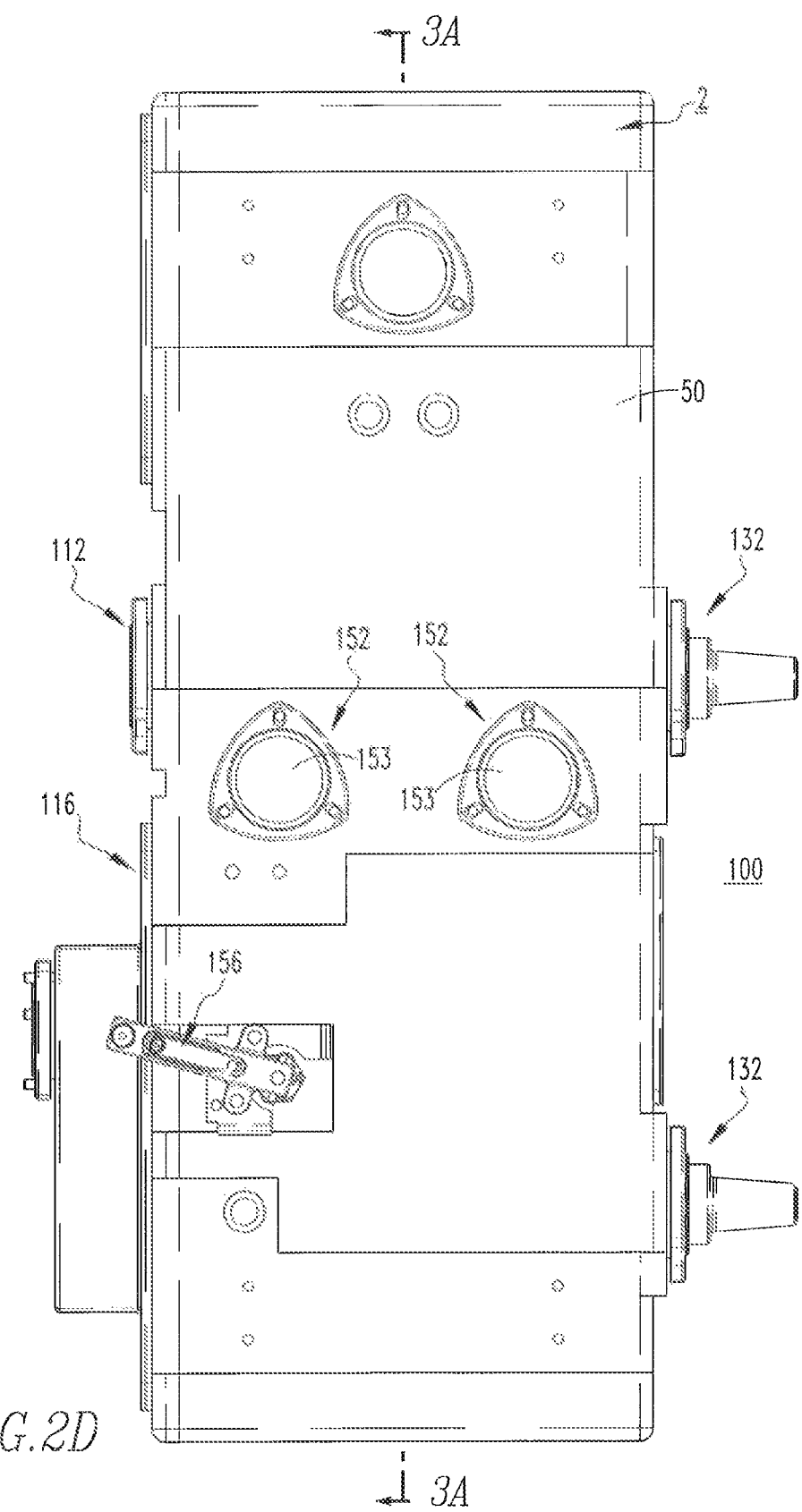
FIG. 2D is a side elevation view of the switchgear assembly and submersible electrical enclosure therefor of FIG. 2A.

As shown in FIG. 2B, the switchgear assembly 100 further includes a number of medium voltage cable bushings (six medium voltage cable bushings 132 are shown and indicated), another number of viewing windows (three viewing windows 172 are shown and indicated), and another number of coupling members (two example coupling members 134,174 are shown exploded in dashed line drawing in FIG. 2B). The viewing windows 172 are each aligned with and mounted to a corresponding one of the mounting edges 72 (FIG. 1B), and each include a respective circular-shaped transparent portion 173 that substantially overlays a corresponding one of the openings 73 (FIG. 1B). Thus, the viewing windows 172 allow an operator to see inside the switchgear assembly 100. The medium voltage cable bushings 132 are each aligned with and mounted to a corresponding one of the mounting edges 32 (FIG. 1B).

Furthermore, the mounting inserts 34,74 (FIG. 1B) advantageously allow the medium voltage cable bushings 132 and the viewing windows 172 to be coupled to the submersible electrical enclosure 2. More specifically, the coupling members 134,174 advantageously extend through a corresponding hole in a corresponding one of the medium voltage cable bushings 132 and the viewing windows 172, and into a corresponding one of the mounting inserts 34,74 (FIG. 1B). Thus, the mounting inserts 34,74 (FIG. 1B) and the coupling members 134,174 advantageously allow the medium voltage cable bushings 132 and the viewing windows 172 to be coupled to the submersible electrical enclosure 2.

Figure 3A:
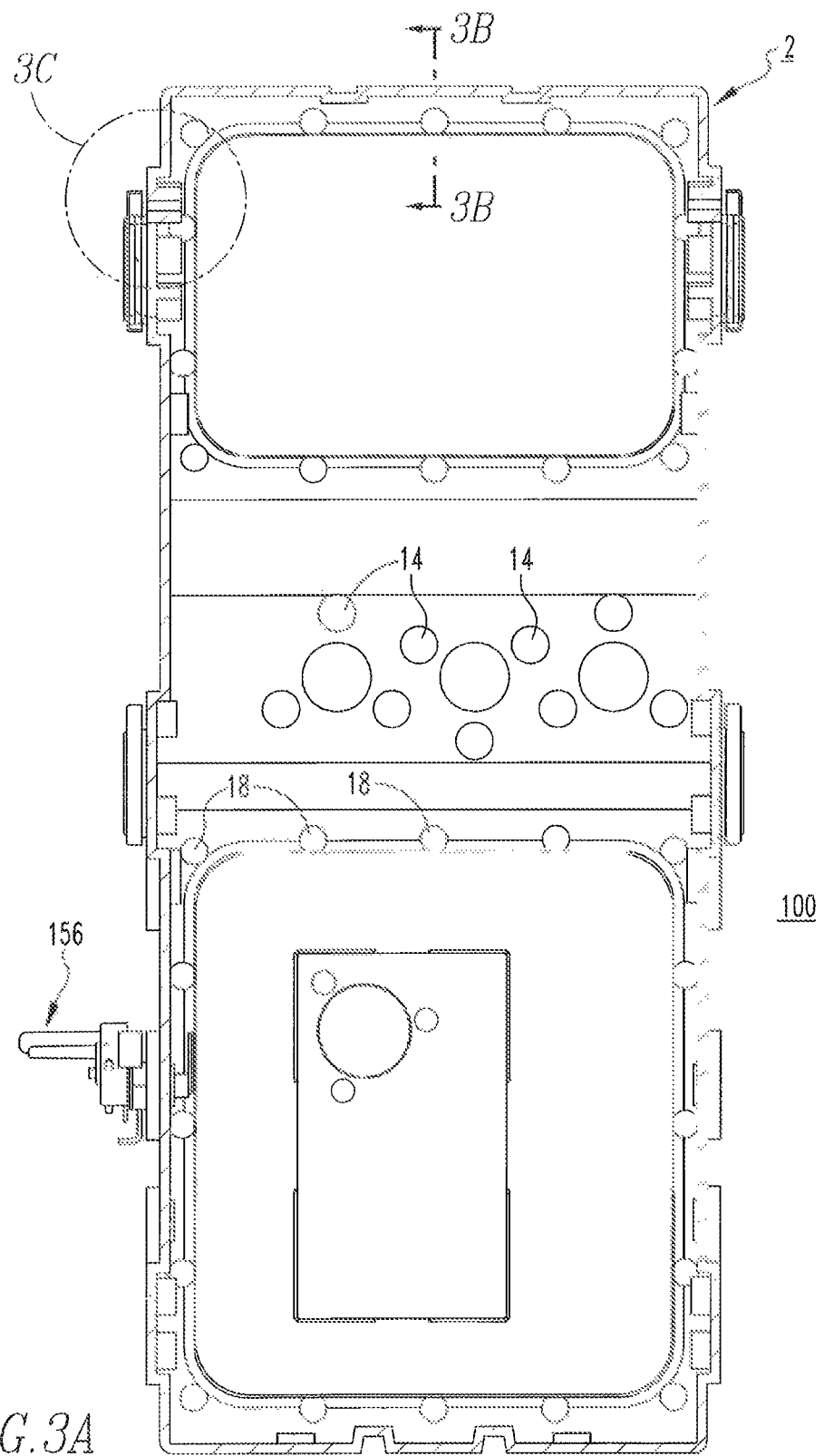
FIG. 3A is a section view of the switchgear assembly and submersible electrical enclosure therefor of FIG. 2D, taken along line 3A-3A.

FIGS. 3A-3C show different section views of the switchgear assembly 100. Referring to the enlarged section view of FIG. 3B, the first side 10 includes a number of layers (e.g., without limitation, conductive polymeric layer 10-1 and insulative polymeric layer 10-2). The conductive polymeric layer 10-1 and the insulative polymeric layer 10-2 are each preferably made of high density polyethylene, and the insulative polymeric layer 10-2 substantially overlays the conductive polymeric layer 10-1. Additionally, the first side 10 further includes another mounting insert (e.g., without limitation, blind insert 20). The blind insert 20 faces away from the interior 4. More specifically, the blind insert 20 has an open end 22, a closed end 24, and a threaded portion 26 extending between the open end 22 and the closed end 24. In other words, the threaded portion 26 does not extend through the blind insert 20. It will be appreciated that the blind insert 20 (FIG. 3A) is structured to receive a coupling member from outside the submersible electrical enclosure 2 (FIGS. 1A and 1B). As shown, and as will be discussed in connection with FIG. 4, the conductive polymeric layer 10-1 and the insulative polymeric layer 10-2 are each molded over the blind insert 20, therefore retaining (i.e., securing) the blind insert 20 on the submersible electrical enclosure 2.

It will also be appreciated that the mounting inserts 14,18, 34,54,74 may be blind inserts substantially the same as the blind insert 20.

Referring to the enlarged section view of FIG. 3C, the third side 50 includes a number of layers (e.g., without limitation, conductive polymeric layer 50-1 and insulative polymeric layer 50-2). The conductive polymeric layer 50-1 and the insulative polymeric layer 50-2 are each preferably made of high density polyethylene, and the insulative polymeric layer 50-2 substantially overlays the conductive polymeric layer 50-1. Additionally, the third side 50 further includes a mounting insert (e.g., without limitation, double blind insert 60). The double blind insert 60 has opposing open ends 61,63, and a closed middle portion 65. Extending from the first open end 61 to the closed middle portion 65 is a first threaded portion 62. Extending from the second open end 63 to the closed middle portion 65 is a second threaded portion 64. The closed middle portion 65 separates the first threaded portion 62 from the second threaded portion 64. In other words, neither the first threaded portion 62 nor the second threaded portion 64 extends through the double blind insert 60. The first threaded portion 62 faces away from the interior 4 and the second threaded portion 64 faces the interior 4. Thus, it will be appreciated that the double blind insert 60 is structured to receive a coupling member (not shown) from outside the submersible electrical enclosure 2, and also structured to receive a coupling member (not shown) from inside the submersible electrical enclosure 2. As shown, and as will be discussed in connection with FIG. 4, the conductive polymeric layer 50-1 and the insulative polymeric layer 50-2 are each molded over the double blind insert 60, therefore retaining (i.e., securing) the double blind insert 60 on the submersible electrical enclosure 2. It will also be appreciated that the mounting inserts 14,18,34,54,74 may be double blind inserts substantially the same as the double blind insert 60.

Although the disclosed concept has been described in association with the first side 10 and the third side 50 having the respective conductive polymeric layers 10-1,50-1 and the respective insulative polymeric layers 10-2,50-2, it will be appreciated that each of the sides (i.e., also the second side 30 and the fourth side 70) of the submersible electrical enclosure 2 likewise include a respective conductive polymeric layer and a respective insulative polymeric layer. The respective conductive polymeric layers of the second side 30 and the fourth side 70 face away from the interior 4. The respective insulative polymeric layers of the second side 30 and the fourth side 70 face the interior 4 and substantially overlay the respective conductive polymeric layers. Additionally, each of the respective conductive polymeric layers and the respective insulative polymeric layers of the second side 30 and the fourth side 70 are likewise preferably made of high density polyethylene.

FIG. 4 shows a schematic diagram, in block form, of a preferred method of manufacturing the submersible electrical enclosure 2 (FIGS. 1A and 1B), in accordance with a non-limiting embodiment of the disclosed concept. As shown, the preferred method involves providing a mold 200 and securing a number of mounting inserts (only one mounting insert 202 is shown and indicated) to the mold 200 with a number of coupling members (two coupling members 204 are shown in simplified form in dashed line drawing). Next, a predetermined quantity of conductive polymeric material 206 is applied to the mold 200. An automated control panel 208 cooperates with a motor 210, which cooperates with the mold 200. After the conductive polymeric material 206 is applied to the mold 200, an operator directs the automated control panel 208 to cause the motor 210 to rotate the mold 200. It will be appreciated that the motor 210 is structured to rotate the mold 200 along two axis of rotation. Next, as the mold 200, and thus the conductive polymeric material 206, are being rotated bi-axially, a heater 212 heats the mold 200, causing the conductive polymeric material 206 to melt. A predetermined quantity of insulative polymeric material 214 is then applied to the conductive polymeric material 206. The mold 200, the conductive polymeric material 206, and the insulative polymeric material 214 are then rotated by the motor 210 and heated by the heater 212. Once the conductive polymeric material 206 and the insulative polymeric material 214 have taken the shape of the mold 200, the mold 200 is cooled. Before removing the conductive polymeric material 206 and the insulative polymeric material 214 (i.e., the submersible electrical enclosure 2 (FIGS. 1A and 1B)) from the mold 200, the coupling members 204 are removed. Because the conductive polymeric material 206 and the insulative polymeric material 214 are molded over the mounting insert 202, the mounting insert 202 is advantageously retained (i.e., secured) on the submersible electrical enclosure 2 (FIGS. 1A and 1B).

It will be appreciated that each of the mounting inserts 14,18,34,54,74 are preferably retained on the submersible electrical enclosure 2 (FIGS. 1A and 1B) in the manner described herein in connection with FIG. 4. Specifically, the mounting inserts 14,18,34,54,74 are preferably secured to the mold 200 with coupling members, such as the example coupling members 204. After the molding process is complete and the conductive polymeric material 206 and the insulative polymeric material 214 are molded over the mounting inserts 14,18,34,54,74, the coupling members 204 are removed and the mounting inserts 14,18,34,54,74 are retained (i.e., secured) on a respective one of the sides 10,30,50,70.

Referring again to FIG. 1A, the first side 10 and the third side 50 each include a respective number of stiffening ledges 11,51. The stiffening ledges extend from proximate the interior 4 of the submersible electrical enclosure 2 in a direction away from the interior 4. Similarly, and with reference to FIG. 1B, the second side 30 and the fourth side 70 each include a respective number of stiffening ledges 31,71 that each extend from proximate the interior 4 in a direction away from the interior 4. It will be appreciated that by employing the stiffening ledges 11,31,51,71 (i.e., by having the surface of the respective sides 10,30,50,70 be relatively uneven), the submersible electrical enclosure 2 is advantageously more rigid. Additionally, the submersible electrical enclosure 2 may have gasketing features (not shown) molded in near the respective mounting edges 12,16,32,52,72 in order to advantageously minimize the chance of leaking during operation.

Referring again to FIGS. 3B and 3C, the conductive polymeric layers 10-1,50-1 (and the respective conductive polymeric layers of the second side 30 and the fourth side 70) face away from the interior 4 of the submersible electrical enclosure 2 (FIGS. 1A and 1B). This can further be understood with reference to FIG. 4, in which the conductive polymeric material 206 was applied first to the mold (i.e., forming the outside layer of the submersible electrical enclosure 2 (FIGS. 1A and 1B)), after which the insulative polymeric material 214 was applied to the mold 200 (forming the inside layer of the submersible electrical enclosure 2 (FIGS. 1A and 1B)). Because the outside of the submersible electrical enclosure 2 is preferably connected to ground, it is preferable for the outside of each of the sides 10,30,50,70 (i.e., the conductive polymeric layers 10-1,50-1, the respective conductive polymeric layers of the second side 30 and the fourth side 70, and the associated conductive polymeric material 206) to be conductive. In this manner, a ground shield is created, advantageously preventing the submersible electrical enclosure 2 (FIGS. 1A and 1B) from becoming charged and potentially harming personnel.

Additionally, the insulative polymeric layers 10-2,50-2 (and the respective insulative polymeric layers of the second side 30 and the fourth side 70) face the interior 4 of the submersible electrical enclosure 2 (FIGS. 1A and 1B). By having the inside of each of the sides 10,30,50,70 (i.e., the insulative polymeric layers 10-2-50-2, the insulative polymeric layers of the second side 30 and the fourth side 70, and the associated insulative polymeric material 214) be an electrical insulator, electrical strike clearance is advantageously improved. In this manner, the submersible electrical enclosure 2 (FIGS. 1A and 1B) may be made smaller than prior art stainless steel submersible electrical enclosures (not shown).

Because the submersible electrical enclosure 2 is preferably made out of high density polyethylene (e.g., as opposed to stainless steel), the submersible electrical enclosure 2 advantageously weighs less and costs significantly less to manufacture than prior art submersible electrical enclosures (not shown). Thus, if the submersible electrical enclosure 2 is mounted to a wall, there will be less stress on the wall. Similarly, because the submersible electrical enclosure 2 weighs less, it will advantageously be easier to lift during installation, maintenance, and/or removal. An additional benefit of the submersible electrical enclosure 2 is the mitigation of condensation. Because the submersible electrical enclosure 2 is preferably made of a polymeric material (e.g., without limitation, high density polyethylene), the need to mitigate condensation (i.e., mitigation by employing heaters) is significantly decreased, as compared to prior art stainless steel electrical enclosures. Moreover, it is preferable for the inside of each of the sides 10,30,50,70 (i.e., the insulative polymeric layers 10-2,50-2 and the respective insulative polymeric layers of the second side 30 and the fourth side 70, and the associated insulative polymeric material 214) to be made of a relatively light color high density polyethylene in order for light to reflect and therefore aide an operator in seeing inside the switchgear assembly 100. Conversely, it is preferable for the outside of each of the sides 10,30,50,70 (i.e., the conductive polymeric layers 10-1,50-1 and the respective conductive polymeric layers of the second side 30 and the fourth side 70, and the associated conductive polymeric material 206) to be made of a relatively dark color high density polyethylene in order to aide in branding and provide resistance to ultraviolet light.

Accordingly, it will be appreciated that the disclosed concept provides for an improved (e.g., without limitation, lighter, less expensive) switchgear assembly (e.g., without limitation, switchgear assembly 100), and submersible electrical enclosure (e.g., without limitation, submersible electrical enclosure 2) and method of manufacturing a submersible electrical enclosure 2 therefor, which among other benefits, employs polymeric materials and a rotational molding process to manufacture the submersible electrical enclosure 2.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of manufacturing a submersible electrical enclosure for a switchgear assembly, said switchgear assembly comprising a number of electrical switching apparatus each structured to be received within an interior of said submersible electrical enclosure, said method comprising the steps of:
   providing a mold;
   securing a mounting insert to said mold with a number of coupling members;
   applying a predetermined quantity of conductive polymeric material to said mold;
   rotating said mold;
   applying a predetermined quantity of insulative polymeric material to said predetermined quantity of conductive polymeric material;
   rotating said mold; and
   removing each of said predetermined quantity of conductive polymeric material and said predetermined quantity of insulative polymeric material from said mold.

2. The method of claim 1 further comprising disconnecting each of said coupling members from said mold before the removing step.

3. The method of claim 2 wherein after the removing step said predetermined quantity of conductive polymeric material and said predetermined quantity of insulative polymeric material comprise a plurality of sides defining an interior; wherein said mounting insert is a double blind insert comprising a first threaded portion, a second threaded portion, and a middle portion; wherein the first threaded portion faces the interior; wherein the second threaded portion faces away from the interior; and wherein the middle portion separates the first threaded portion from the second threaded portion.

4. The method of claim 2 wherein after the removing step said predetermined quantity of conductive polymeric material and said predetermined quantity of insulative and polymeric material comprise a plurality of sides defining an interior; and wherein said mounting insert is a blind insert facing away from the interior.

5. The method of claim 1 wherein after the removing step said predetermined quantity of conductive polymeric material and said predetermined quantity of insulative polymeric material comprise a plurality of sides defining an interior; wherein each of said plurality of sides comprises a number of stiffening ledges; and wherein each of said stiffening ledges extends from proximate the interior in a direction away from the interior.

6. The method of claim 1 wherein each of said conductive polymeric layer and said insulative polymeric layer is made of high density polyethylene.

7. A method of manufacturing a submersible electrical enclosure for a switchgear assembly, said switchgear assembly comprising a number of electrical switching apparatus each structured to be received within an interior of said submersible electrical enclosure, said method comprising the steps of:
   providing a mold;
   securing a plurality of mounting inserts to said mold with a plurality of coupling members;
   applying a predetermined quantity of conductive polymeric material to said mold;
   rotating said mold;
   applying a predetermined quantity of insulative polymeric material to said predetermined quantity of conductive polymeric material;
   rotating said mold; and
   removing each of said predetermined quantity of conductive polymeric material and said predetermined quantity of insulative polymeric material from said mold;
   wherein after the removing step said predetermined quantity of conductive polymeric material and said predetermined quantity of insulative polymeric material comprise a plurality of sides defining an interior; wherein said plurality of sides comprises a first side, a second side, a third side, and a fourth side; wherein the first side is opposite and generally parallel to the second side; wherein the third side is opposite and generally parallel to the fourth side; wherein each of the first side and the second side extends from the third side to the fourth side; wherein at least one of the first side, the second side, the third side, and the fourth side has at least one mounting edge defining an opening; and wherein said plurality of mounting inserts generally surround said at least one mounting edge.

8. The method of claim 7 further comprising disconnecting each of said coupling members from said mold before the removing step.

9. The method of claim 7 wherein each of the first side, the second side, the third side, and the fourth side has a plurality of mounting edges each defining a respective opening; wherein at least one of said mounting edges of the first side is rectangular-shaped; and wherein a plurality of said mounting edges of each of the first side, the second side, the third side, and the fourth side are circular-shaped.

10. A method of manufacturing a switchgear assembly comprising the steps of:
    providing a mold;
    applying a predetermined quantity of conductive polymeric material to said mold;
    rotating said mold;
    applying a predetermined quantity of insulative polymeric material to said predetermined quantity of conductive polymeric material;
    rotating said mold;
    removing each of said predetermined quantity of conductive polymeric material and said predetermined quantity of insulative polymeric material from said mold, wherein after the removing step said predetermined quantity of conductive polymeric material and said predetermined quantity of insulative polymeric material comprise a plurality of sides defining an interior; and
    providing a number of electrical switching apparatus each received within the interior.

11. The method of claim 10 wherein said plurality of sides comprises a first side, a second side, a third side, and a fourth side; wherein the first side is opposite and generally parallel to the second side; wherein the third side is opposite and generally parallel to the fourth side; wherein each of the first side and the second side extends from the third side to the fourth side; wherein at least one of the first side, the second side, the third side, and the fourth side has a mounting edge defining an opening; and wherein the method further comprises the step of:
    mounting an access cover to said mounting edge.

12. The method of claim 10 wherein said plurality of sides comprises a first side, a second side, a third side, and a fourth side; wherein the first side is opposite and generally parallel to the second side; wherein the third side is opposite and generally parallel to the fourth side; wherein each of the first side and the second side extends from the third side to the fourth side; wherein each of the first side, the second side, the third side, and the fourth side comprises at least one mounting edge; wherein said at least one mounting edge of the first side comprises a rectangular-shaped edge and a first plurality of circular-shaped edges; wherein said at least one mounting edge of the second side comprises a second plurality of circular-shaped edges; wherein said at least one mounting edge of the third side comprises a third plurality of circular-shaped edges; wherein said at least one mounting edge of the fourth side comprises a fourth plurality of circular-shaped edges; and wherein the method further comprises the steps of:

providing a plurality of medium voltage cable bushings, a first plurality of viewing windows, a second plurality of viewing windows, and a third plurality of viewing windows;

mounting each of said cable bushings to a corresponding one of said second plurality of circular-shaped edges;

mounting each of said first plurality of viewing windows to a corresponding one of said first plurality of circular-shaped edges;

mounting each of said second plurality of viewing windows to a corresponding one of said third plurality of circular-shaped edges; and mounting each of said third plurality of viewing windows to a corresponding one of said fourth plurality of circular-shaped edges.

13. The method of claim 10 wherein each of said conductive polymeric layer and said insulative polymeric layer is made of high density polyethylene.

14. The method of claim 10 wherein each of said plurality of sides comprises a number of stiffening ledges; and wherein each of said stiffening ledges extends from proximate the interior in a direction away from the interior.

15. The method of claim 10 further comprising securing a mounting insert to said mold with a number of coupling members after the providing a mold step.

16. The method of claim 15 further comprising disconnecting each of said coupling members from said mold before the removing step.

17. The method of claim 16 wherein said mounting insert is a double blind insert comprising a first threaded portion, a second threaded portion, and a middle portion; wherein the first threaded portion faces the interior; wherein the second threaded portion faces away from the interior; and wherein the middle portion separates the first threaded portion from the second threaded portion.

18. The method of claim 10 further comprising securing a plurality of mounting inserts to said mold with a plurality of coupling members after the providing a mold step; wherein said plurality of sides comprises a first side, a second side, a third side, and a fourth side; wherein the first side is opposite and generally parallel to the second side; wherein the third side is opposite and generally parallel to the fourth side; wherein each of the first side and the second side extends from the third side to the fourth side; wherein at least one of the first side, the second side, the third side, and the fourth side has at least one mounting edge defining an opening; and wherein said plurality of mounting inserts generally surround said at least one mounting edge.

19. The method of claim 18 further comprising disconnecting each of said coupling members from said mold before the removing step.

\* \* \* \* \*